United States Patent [19]

Behbin

[11] Patent Number: 5,237,274

[45] Date of Patent: Aug. 17, 1993

[54] NMR PROBE

[75] Inventor: Ali Behbin, San Mateo, Calif.

[73] Assignee: Varian Associates, Inc., Palo Alto, Calif.

[21] Appl. No.: 796,282

[22] Filed: Nov. 22, 1991

[51] Int. Cl.⁵ ............................................. G01R 33/20
[52] U.S. Cl. .................................................... 324/318
[58] Field of Search ............... 324/300, 307, 308, 309, 324/310, 311, 312, 313, 314, 318, 322

[56] References Cited

U.S. PATENT DOCUMENTS 4,628,264 12/1986 Rzedzian ............................ 324/318
4,956,609 9/1990 Miyajima ............................ 324/318

OTHER PUBLICATIONS

Cardwell et al. "Problems With Coil Materials," *Texas A & M University NMR Newsletter*, No. 398, Nov. 1991, p. 398-27.

Primary Examiner—Michael J. Tokar
Attorney, Agent, or Firm—Gerald M. Fisher

[57] ABSTRACT

For reduction of noise in proton resonance measurements, high voltage RF capacitors in the NMR probe comprised a fluorinated oil or grease dielectric.

7 Claims, 4 Drawing Sheets

NMR PROBE

Field of the Invention

This invention relates to improvements to probes for NMR by reducing non-sample induced signal.

BACKGROUND OF THE INVENTION

An important analytical technique known as Nuclear Magnetic Resonance Spectroscopy (NMR) has become increasingly important since its invention in 1946. When atomic nuclei are placed in a constant, homogeneous static magnetic field of high intensity and simultaneously subjected to a certain specified radio frequency alternating field, a transfer of energy can take place in which the oriented nuclei are pictured as flipping to another orientation. If the RF energy is applied in pulses, when the pulses are off, the nuclei are said to relax and during this relaxation they process about the direction of the fixed magnetic field. If a coil of wire is positioned closely to the precessing nuclei of the sample, an electrical signal will be induced in the coil. This observed signal caused by the relaxing nuclei is known as the NMR signal. Since each nuclei, i.e., material, has a unique NMR signal, this spectrometer is important in a great many fields of research.

The apparatus of an NMR spectrometer is simple in principle, but in practice the design and manufacture are extremely demanding because of the very small signal generated by the precessing nuclei. In NMR, for example, any source of stray RF energy can introduce noise, especially if it excites nuclear resonances of the same nuclei that are not in the sample. For example, in proton NMR, since there are strong fixed magnetic fields and RF excitation fields in close proximity to the signal receiver coil, it is very important to reduce sources of proton resonance interference outside the sample of interest.

The part of the NMR spectrometer which contains the coils that interact with the sample is called the probe. The probe includes a saddle coil for providing the RF excitation to the sample and for detecting the precessing nuclei. This coil must be capable of being very accurately tuned and matched for maximum power transfer. Additionally, another coil is occasionally employed in a probe for irradiating the sample at high power. This coil is known as a decoupler coil, which is used in special experiments where broadband RF power is employed to disrupt coupling between different nuclei. In modern spectrometers it is also known to shape the excitation pulse in order to achieve selective excitations at higher power at selective excitation frequency for experiments. For tuning the coils, it is necessary to include in the probe fairly large capacitive reactance in the form of adjustable high voltage capacitors in order to tune to the frequency of interest, and to match the impedance of the probe to the transmission lines to the transmitter and receiver circuits for maximum power transfer. Arcing of these capacitor having teflon-air dielectric is a common problem. The probe is generally tuned for highest signal to noise ratio at the reciever.

It is an object of this invention to enable reliable high power tuned circuits for excitation of an NMR sample without introducing into the receiver spectral artifact due to the non-sample signal into the receiver that overlaps with the observed frequencies of the nuclei of the sample being tested.

It is a feature of this invention that the probe's high power capacitors are made from materials that do not contain hydrogen to eliminate interference from proton resonances of hydrogen.

It is a further feature of this invention that the high power probe capacitors employ fluorinated dielectric oil or grease, for example KRYTOX ®, a trademarked product of DuPont.

DESCRIPTION OF DRAWING

FIG. 3A is obtained with the improved capacitor dielectric oil as compared to a probe with hydrogenated silicone oil dielectric.

DETAILED DESCRIPTION OF THE INVENTION

Figure 1:
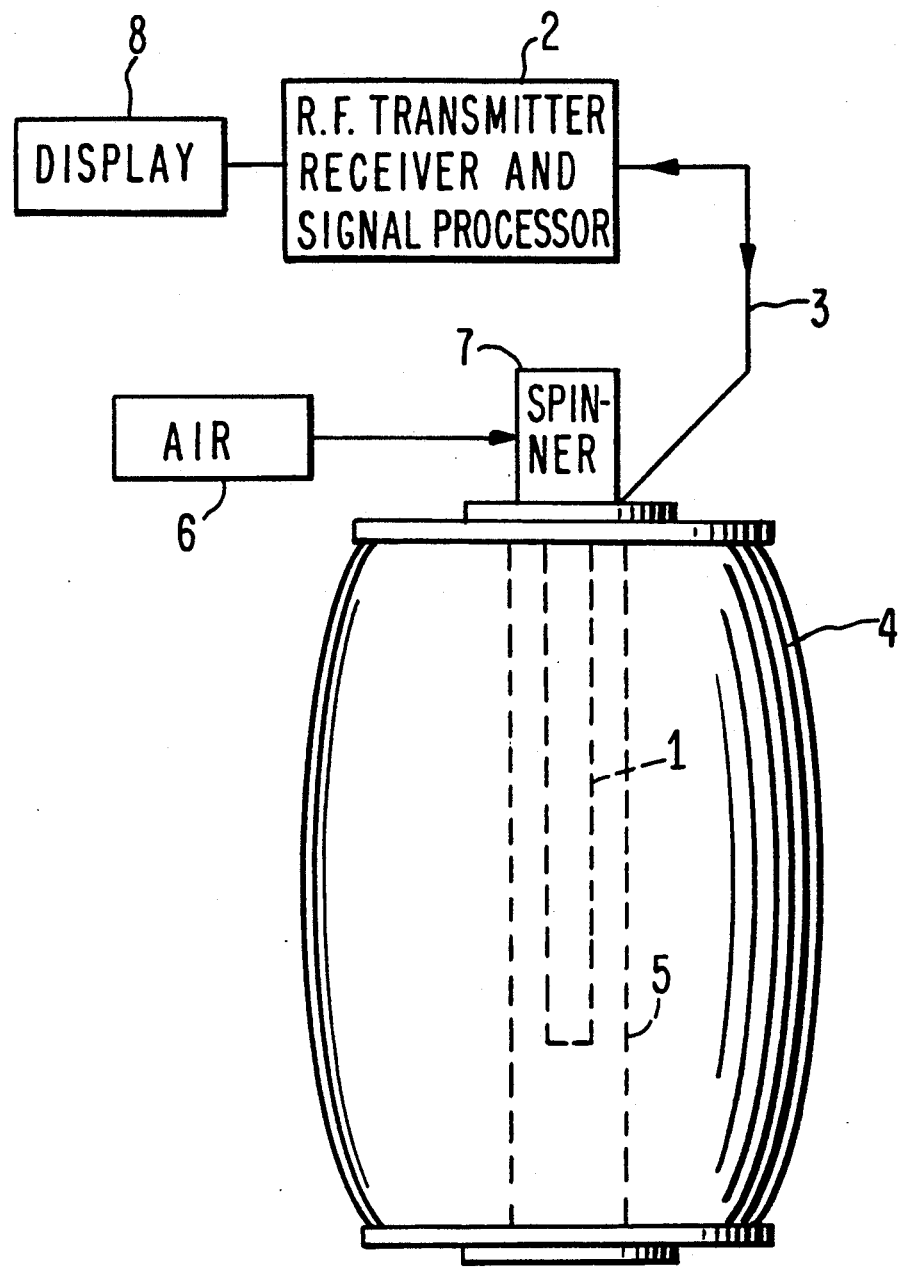
FIG. 1 is an overall system block diagram of a superconducting magnet NMR spectrometer system.
Figure 2:
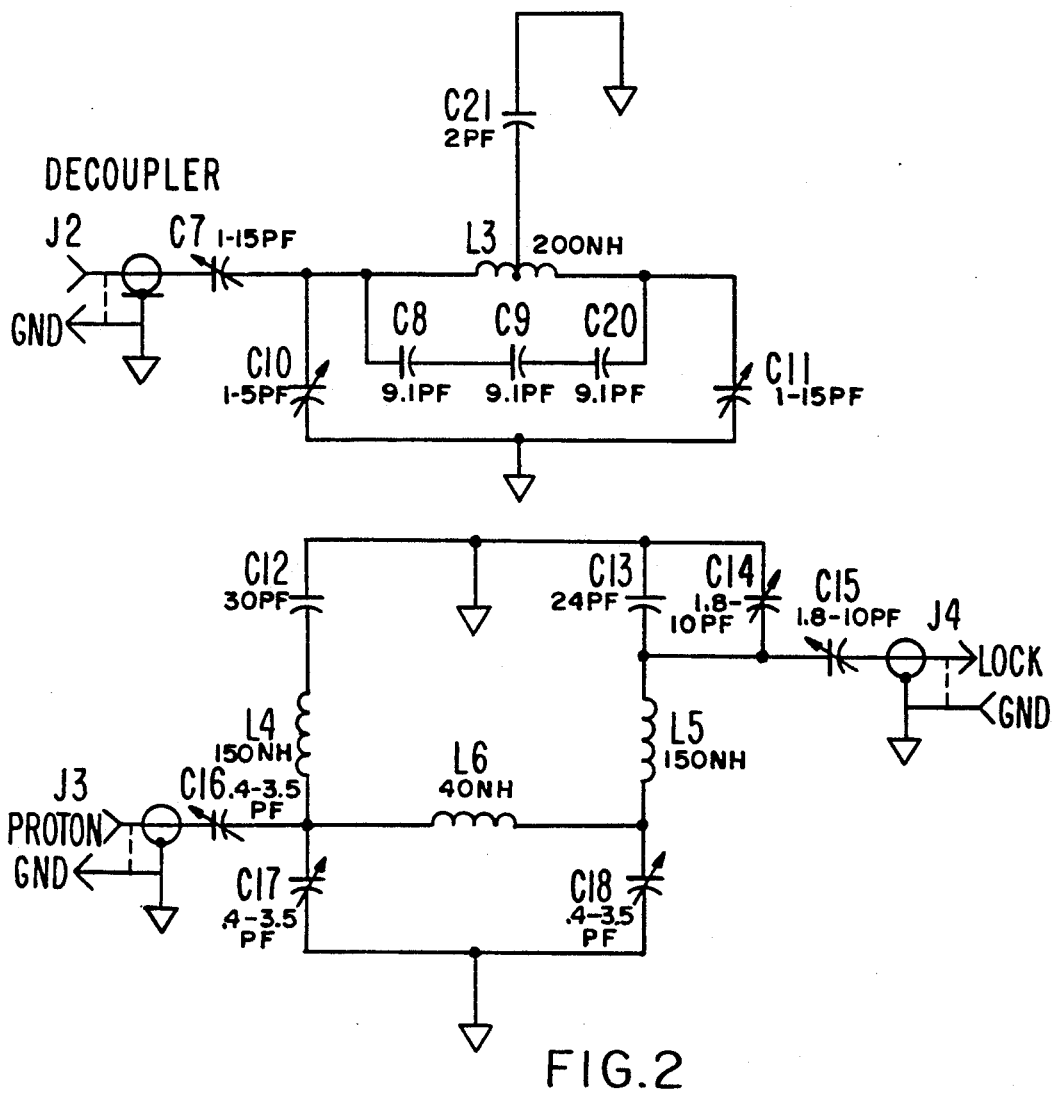
FIG. 2 is an electrical schematic of the spectrometer probe including the transmit/receive and decoupler coil circuits.

With reference to FIG. 1, a probe structure 1 is shown installed in a narrow bore 5 of a high field NMR cryogenic magnet 4. The sample to be studied is inserted into a sample test tube (not shown) which is gripped, suspended and rotated at high speed by a spinner 7 inside of the probe structure 1. The probe is a long narrow diameter cylindrical shape, approximately 2 feet long and 1.5 inches in diameter. The probe contains the power and signal wires, coils and tuning capacitors necessary to support the particular experiment and is coupled to RF transmitter and receiver 2 via connections 3. With reference to FIG. 2, the electrical schematic is shown for a preferred probe for performing a decoupling experiment.

Specifically, the saddle coil is the transmitter/receiver coil for the nuclei and physically surrounds the sample as closely as possible. One end of L4 is connected to the coaxial shielded plug J3 via adjustable capacitor C16. A pair of adjustable capacitors C17 and C18 are connected to ground on one end and to L4 and L5 respectively on their other end. L6 is connected in parallel with the capacitors C17 and C18. Capacitor C12 and C13 are connected to ground on one end and the other ends are connected L4 and L5 respectively. Fixed capacitor C14 is parallel with capacitor C13. The lock channel frequency is withdrawn from the non-ground side of C14 via adjustable capacitor C15 and shielded coaxial plug J4.

A second coil L3 is coupled to the high power decoupler transmitter via coaxial plug J2 via variable capacitor C7. In parallel with L3 are the fixed value capacitors C8, C9 and C20. Variable capacitors C10 and C11 are connected to ground on one end, and the other ends are connected to opposite ends of L3. A center tap on L3 is taken to ground through fixed capacitor C21. Decoupler coil L3 is further displaced radially from the sample than the transmit/receive coil.

Figures 3A, 3B:
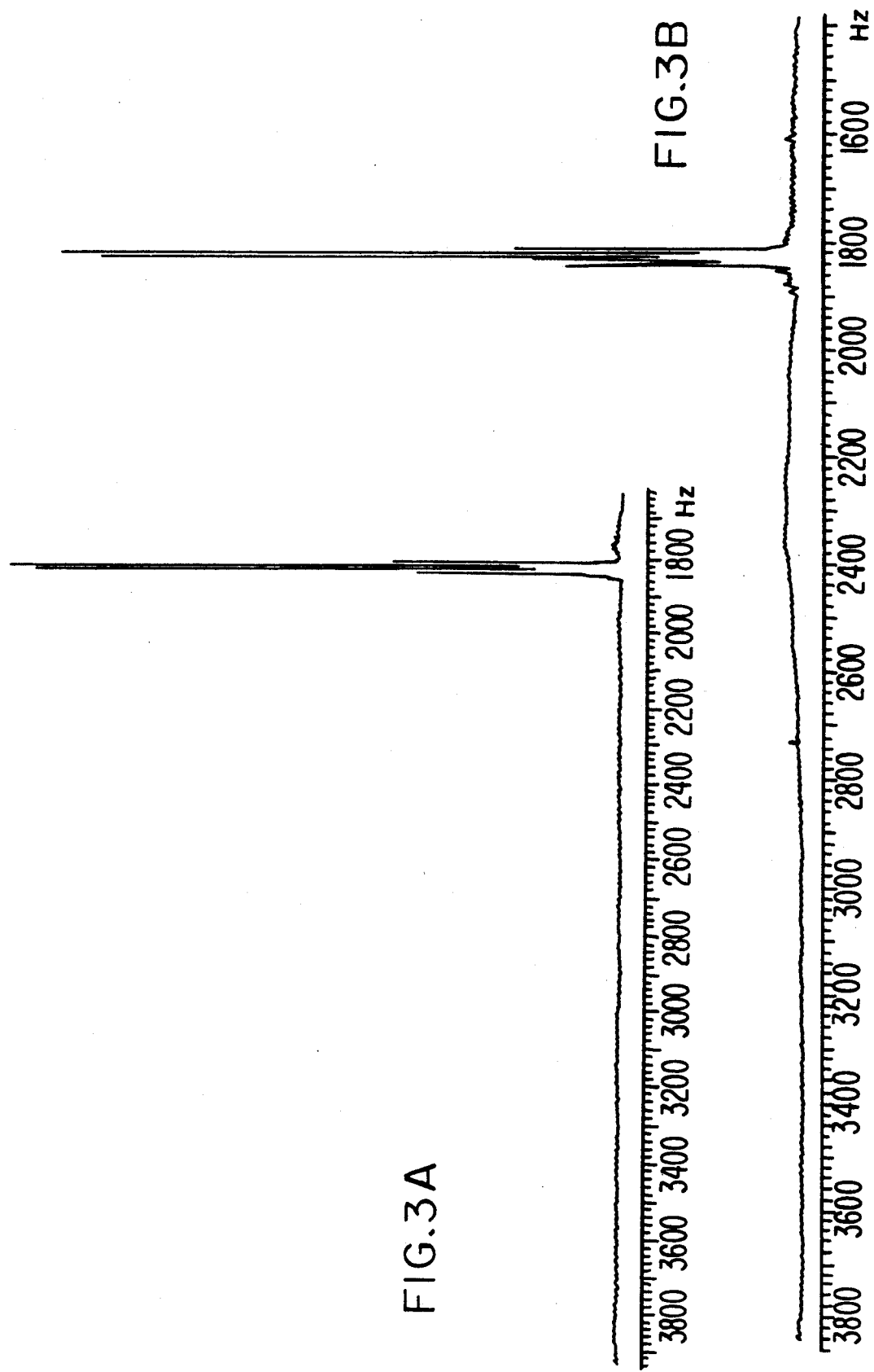
FIG. 3A and FIG. 3B are spectra obtained from a standard experiment with an 0.1% ethylbenzene sample in probe.

In the embodiment of FIG. 2, the variable capacitor C7, C10 and C11 in the decoupler channel are required to carry high power in order to irradiate the sample with sufficient broad band energy to accomplish the decoupling experiments. Recently, the capacitors have been filled with high dielectric silicone oil to overcome the arcing problem at high power. I have discovered that the hydrogen atoms in the oil used in these capacitors in the previous equipment were being excited to a nuclear resonant condition during a proton experiment because of the high magnetic fields and stray RF fields at the porton excitation frequency in the regions of the probe near the capacitors. When the prior oil such as an hydrogenated oil, i.e., dimethylsilicone, was employed, the spectra of FIG. 3B was obtained with a 0.1.% ethylbenzene sample in a standard S/N test resulted in a S/N ratio of 420/1 and exhibits a bumpy baseline which peaks around 2300 Hz. After the hydrogenated dielectric oil filled capacitors were removed and replaced with capacitors filled with a fluorinated oil such as perfluoroalkyl-polyethers telomers of tetrafluoroethylene sodium nitrite (KRYTOX) was inserted into the probe, the spectra of FIG. 3A was obtained. FIG. 3A exhibits a S/N ratio of 536.7/1 and the baseline is very much flatter across the same frequency range for the same test conditions. Tests have been successfully performed to demonstrate that the fluorinated oil of this invention can withstand at least the same high power RF power application without breakdown as the prior hydrogenated oil. It is believed that other fluorinated oils or greases could be successfully used in this application.

It is anticipated that in future high power experiments such as stocastic excitation that the variable capacitors in the transmit channel, C16, C17, and C18 may also cause resonance interference and that it would be advantageous to insert non-interfering dielectric oil in those capacitors also. In the current tests, because the transmit/receive coil L3 is very much closer physically to the sample, the amount of power employed for the excitation is much smaller than is required when the more distant decoupler coil is being employed. For this reason, no significant S/N ratio reduction is observed when the dielectric is air.

Figure 4:
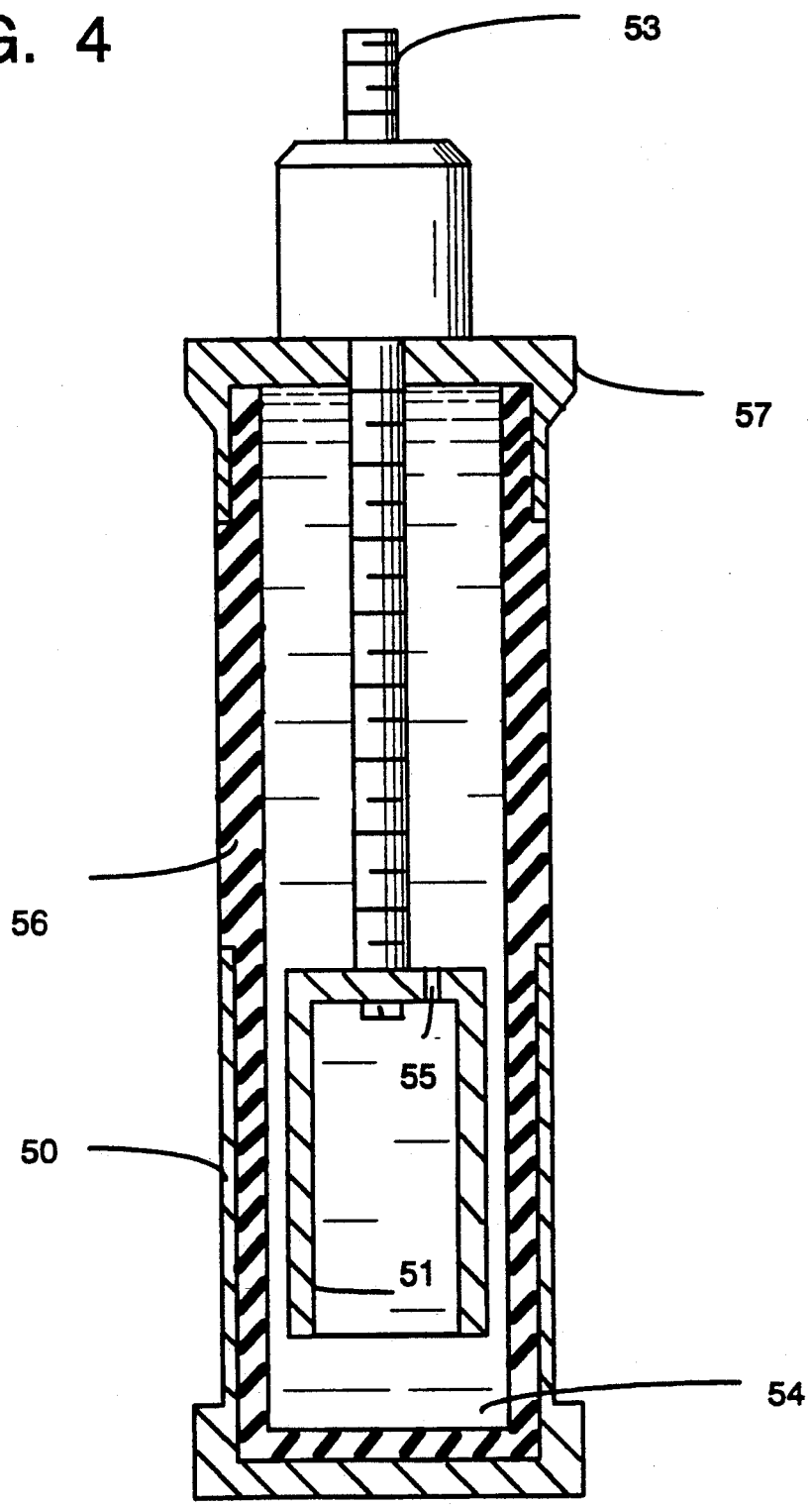
FIG. 4 is a cross section of a variable capacitor filled with nonhydrogenated dielectric oil.

FIG. 4 is a cross section of a type of variable capacitor employed in current probes. The capacitor is made from two electrostatically coupled metal cups 50 and 51, preferably made from silver with the central cup being mounted to be axially moveable with respect to the outer cup, via adjusting screw 53 and screw 53 is in contact with cap 57. The entire region 54 inside the capacitor is filled and sealed with a high dielectric oil to preclude arcing at the high voltage and power levels employed. Teflon spacers 56 are employed to maintain isolation and alignments of sliding parts. The inner top of cup 51 has an aperture 55.

It is the intention of the inventor to embody within the patent all changes and modifications which properly come within the contribution to the art.

I claim:

1. In a method of tuning an NMR probe to proton resonance comprising,
   providing a container for supporting a pair of adjustable metallic interleaving parts, including electrical contacts attached to each said pair of parts;
   filing said container with a dielectric oil;
   sealing said container;
   mounting said container in an NMR probe, and connecting said electrical contacts to said NMR probe; and tuning said probe to proton resonance by moving said metallic interleaving parts relative to one another and adjusting until the highest signal to noise is achieved;
   The Improvement Comprising,
   wherein said step of filing with a dielectric oil comprises filing with a fluorinated oil.
2. The method of claim 1 wherein said fluorinated dielectric oil is KRYTOX.
3. A method of selecting a high power probe for an NMR experiment comprising,
   selecting prior to said experiment the specific nuclei to be excited;
   perform a first selection of probes containing RF tuning capacitors by selecting only those with high dielectric constant fluid therein to avoid arcing; and
   performing a second selection from among those said probes selected in said first selection, said second selection being to eliminate all probes having any of the said specific experimental nuclei in the dielectric oil in the RF tuning capacitors of said probe.
4. A new method of using a fluorinated dielectric oil comprising,
   filling variable capacitors employed in a proton NMR probe with said fluorinated dielectric oil; performing proton NMR experiments using said NMR probe with fluorinated dielectric oil.
5. The method of claim 4 wherein said fluorinated oil is KRYTOX.
6. In an NMR spectrometer including a high field magnet bore for receiving a probe, an RF transmitter and receiver connected to said probe, said probe including coils to excite and observe NMR signals in a sample in said probe, a spinner system for spinning a sample tube holding said sample in said probe,
   The Improvement Comprising:
   said coils in said probe including transmit/receive and decoupling coils; at least one of said coils being connected to said RF transmitter and receiver through a variable capacitor, said variable capacitor being filled with fluorinated, non-hydrogenated dielectric oil.
7. The spectrometer of claim 6 wherein the said fluorinated oil is a registered trademark product called KRYTOX.

* * * * *